(12) United States Patent
Kosemura et al.

(10) Patent No.: US 6,800,936 B2
(45) Date of Patent: Oct. 5, 2004

(54) HIGH-FREQUENCY MODULE DEVICE

(75) Inventors: Takahiko Kosemura, Kanagawa (JP);
Akihiko Okubora, Kanagawa (JP);
Takayuki Hirabayashi, Tokyo (JP);
Tatsuya Ogino, Kanagawa (JP);
Kuniyuki Hayashi, Oita (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/332,015

(22) PCT Filed: May 2, 2002

(86) PCT No.: PCT/JP02/04409
§ 371 (c)(1),
(2), (4) Date: Jan. 3, 2003

(87) PCT Pub. No.: WO02/091405
PCT Pub. Date: Nov. 14, 2002

(65) Prior Publication Data
US 2003/0148739 A1 Aug. 7, 2003

(30) Foreign Application Priority Data
May 7, 2001 (JP) ........................................ 2001-136490

(51) Int. Cl.$^7$ .......................... H01L 23/24; H01L 23/52; H01L 29/40; H05K 1/18
(52) U.S. Cl. .................. 257/748; 257/724; 361/761
(58) Field of Search .................. 257/724, 748, 257/749; 361/761, 814

(56) References Cited
U.S. PATENT DOCUMENTS

| 4,945,323 | A | * | 7/1990 | Gerstenberg et al. | ....... 333/185 |
|---|---|---|---|---|---|
| 5,483,100 | A | * | 1/1996 | Marrs et al. | ................ 257/700 |
| 6,005,197 | A | * | 12/1999 | Kola et al. | ................... 174/260 |
| 6,218,729 | B1 | * | 4/2001 | Zavrel et al. | ............... 257/698 |
| 6,274,937 | B1 | * | 8/2001 | Ahn et al. | ................... 257/777 |
| 6,455,885 | B1 | * | 9/2002 | Lin | ............................ 257/300 |

FOREIGN PATENT DOCUMENTS

| JP | 11-312609 | 9/1999 | | |
|---|---|---|---|---|
| JP | 2000-114906 | 4/2000 | | |
| JP | 2000189937 | * 6/2000 | ........... H01L/27/04 |
| JP | 2001-77315 | 3/2001 | | |

* cited by examiner

Primary Examiner—Tuan H. Nguyen
Assistant Examiner—William Vesperman
(74) Attorney, Agent, or Firm—Sonnenschein, Nath & Rosenthal LLP

(57) ABSTRACT

The present invention provides a high-frequency module configuring a micro communication functional module, which includes a base substrate (2) which has multiple pattern wiring layers (6a) (6b) (9a) (9b) and dielectric insulating layers (5) (8) (11) formed therein, and has a buildup surface for smoothing the upper layer thereof, and a high-frequency element layer (4) formed on the buildup surface, which has an inductor (20) formed therein via an insulating layer (19) formed on the buildup surface. The base substrate (2) is provided with a region (30) where the pattern wiring layers (6a) (6b) (9a) (9b) are not formed from the upper layer to at least the mid portion thereof along the thickness direction, and the inductor (20) of the high-frequency element layer (4) is formed directly above the region (30).

5 Claims, 5 Drawing Sheets

HIGH-FREQUENCY MODULE DEVICE

TECHNICAL FIELD

The present invention relates to a high-frequency module for configuring a micro communication functional module having an information communication function and a storage function, which is associated with various electronic equipments such as a personal computer, a portable telephone, audio equipment, etc.

BACKGROUND ART

Recently, as the digitization of data has been promoted, various types of information such as music information, audio information, and video information can be easily utilized by using a personal computer and a mobile computer. Under the bandwidth compression using the audio codec technique and the video codec technique, such information is easily and efficiently distributed to various communication terminal equipments by digital broadcasting. For example, audio and video data (AV data) can be received by an outdoor portable telephone.

The data transmission and reception systems have been put to practical use widely even in a small-sized area such as a household since desirable network systems have been suggested. As the network systems, there are proposed various wireless communication systems for the next generation such as a narrow band radio communication system of 5 GHz shown in the IEEE 802.11a, a radio LAN system of 2.45 GHz shown in the IEEE 802.11b, and a short-range radio communication system called Bluetooth.

In the data transmission and reception systems, by effectively utilizing such wireless network systems, various data can be transmitted and received easily at various places such as households and outdoors without using a repeater or a repeater station. Also, it becomes possible to have an access to the internet to transmit and receive various data.

On the other hand, in the data transmission an reception systems, small-sized portable communication terminal equipments having an above-described communication function have to be inevitably realized. In communication terminal equipment, a transmission and reception unit is required to perform modulation and demodulation processing for analog high-frequency signals. Thus, in communication terminal equipment, a high-frequency transmission and reception circuit of the superheterodyne system for converting transmission and reception signals to intermediate frequency signals is generally arranged.

The high-frequency transmission and reception circuit has an antenna unit for transmitting and receiving information signals which has an antenna and a changeover switch, and a transmission/reception switching unit for performing switching operation between transmission operation and reception operation. Also, the high-frequency transmission and reception circuit has a reception circuit which consists of a frequency conversion circuit, a demodulation circuit, etc. Moreover, the high-frequency transmission and reception circuit has a transmission circuit which consists of a power amplifier, a chive amplifier, a modulation circuit, etc. Furthermore, the high-frequency transmission and reception circuit has a reference frequency generation circuit for providing the reception unit and the transmission unit with a reference frequency.

The configured high-frequency transmission and reception circuit has large-sized functional elements such as various filters inserted between respective stages, a voltage-controlled oscillator (VCO), an SAW filter, etc., and a great number of passive elements such as inductors, resistors, capacitors, etc. which are particular to a high-frequency analog circuit such as a matching circuit or a bias circuit. Respective circuits in the high-frequency transmission and reception circuit are configured in the form of ICs. However, filters inserted between respective stages cannot be arranged in ICs, and therefor a matching circuit has to be arranged at outside of ICs. So, the high-frequency transmission and reception circuit is large in size as a whole, which obstacles miniaturization and decreasing in weight of a communication terminal equipment.

On the other hand, in a communication terminal equipment, a high-frequency transmission and reception circuit of the direct conversion system which does not convert transmission and reception signals to intermediate frequency signals is also used. In such a high-frequency transmission and reception circuit, information signals received by an antenna unit are sent to a demodulation circuit via a transmission/reception switching unit to be baseband-processed directly. Also, in the high-frequency transmission and reception circuit, information signals generated by a source unit are directly modulated to signals of a predetermined frequency band by a modulation unit without converting the transmission signals to intermediate frequency signals, and thus modulated signals are transmitted from the antenna unit via an amplifier and the transmission/reception switching unit.

In the configured high-frequency transmission and reception circuit, information signals can be received by performing direct detection without converting reception signals into intermediate frequency signals. As the number of parts or elements such as filters can be reduced, the high-frequency transmission and reception circuit can have its entire configuration simplified, and can be substantially configured in the form of one chip. Even in the high-frequency transmission and reception circuit of the direct conversion system, filters and a matching circuit arranged at downstream stages have to be taken into consideration. Also, since amplification processing is performed only one time in a high-frequency stage of the high-frequency transmission and reception circuit, it becomes difficult to obtain enough gain, and amplification processing has to be performed also in a baseband unit. Thus, the high-frequency transmission and reception circuit requires a cancellation circuit of DC offset and an extra low pass filter, which undesirably increases entire power consumption.

As has been described above, in the conventional high-frequency transmission and reception circuit of both the superheterodyne system and the direct conversion system, satisfactory characteristics fulfilling a required specification of miniaturization and decreasing decrease in weight of a communication terminal equipment cannot be obtained. Thus, it is proposed that the high-frequency transmission and reception circuit be configured in the form of a simplified small-sized module using a Si-CMOS circuit as a base. That is, for example, there is proposed a one-chip high-frequency module in which passive elements of high characteristics are arranged on an Si substrate, filters and a resonator are built in a LSI, and a logic LSI of a baseband unit is integrated.

In the high-frequency module, when inductors are arranged on an Si substrate, the Si substrate is provided with holes directly under the inductors, or space is prepared between the inductors and the Si substrate in order to improve the characteristics of the inductors, which undesirably increases the manufacturing cost.

In case the front end of a high-frequency signal circuit is formed on a semiconductor substrate made of Si, SiGe, etc. or on a glass substrate, in addition to a high-frequency signal circuit pattern, a power supply pattern, a ground pattern, and a signal wiring pattern for performing control processing are required to be formed as pattern wiring layers. As multiple pattern wiring layers are formed, there arises a problem of mutual interference between pattern wiring layers, and also the manufacturing cost is undesirably increased.

In case the entire high-frequency module is packaged, the high-frequency module is mounted to an interposer (intermediate substrate) by undergoing wire bonding. However, undesirably, the area for mounting the high-frequency module is caused to be large and the entire thickness is caused to be increased, and also the manufacturing cost is undesirably increased.

DISCLOSURE OF THE INVENTION

Accordingly, the present invention has an object to overcome the above-mentioned drawbacks of the prior art by providing a high-frequency module which is small in size and inexpensive, and can improve the characteristics of inductors.

The above object can be attained by providing a high-frequency module, including:

a base substrate which has multiple pattern wiring layers and dielectric insulating layers formed therein, and has a buildup surface for smoothing the upper layer thereof; and a high-frequency element layer formed on the buildup surface, which has an inductor formed therein via an insulating layer formed on the buildup surface;

wherein the base substrate is provided with a region where the pattern wiring layers are not formed from the upper layer to at least the mid portion thereof along the thickness direction, and the inductor of the high-frequency element layer is formed directly above the region.

According to the high-frequency module employing the present invention, since the inductors are formed directly above the regions where the pattern wiring layers of the base substrate are not formed, the coupling capacitance between the inductors and the pattern wiring layers can be reduced, and high Q value of the inductors can be obtained.

BRIEF DESCRIPTION OF THE DRAWINGS

FIG. 3A to FIG. 3C show plan views showing the configuration of the wiring inhibition region at respective layers of a base substrate, in which FIG. 3A shows a wiring inhibition hole formed at a fourth wiring layer, FIG. 3B shows a wiring inhibition hole formed at a third wiring layer, and FIG. 3C shows a ground pattern formed on a second wiring layer.

FIG. 5A to FIG. 5C show plan views showing the configuration of the inductor at respective layers of a high-frequency element layer, in which FIG. 5A shows a pullout conductor pattern formed on a first insulating layer, FIG. 5B shows an embedded conductor pattern embedded in a second insulating layer, and FIG. 5C shows a thin film coil pattern formed on the second insulating layer.

BEST MODE FOR CARRYING OUT THE INVENTION

The high-frequency module of the present invention will further be described below concerning the best modes with reference to the accompanying drawings.

Figure 1:
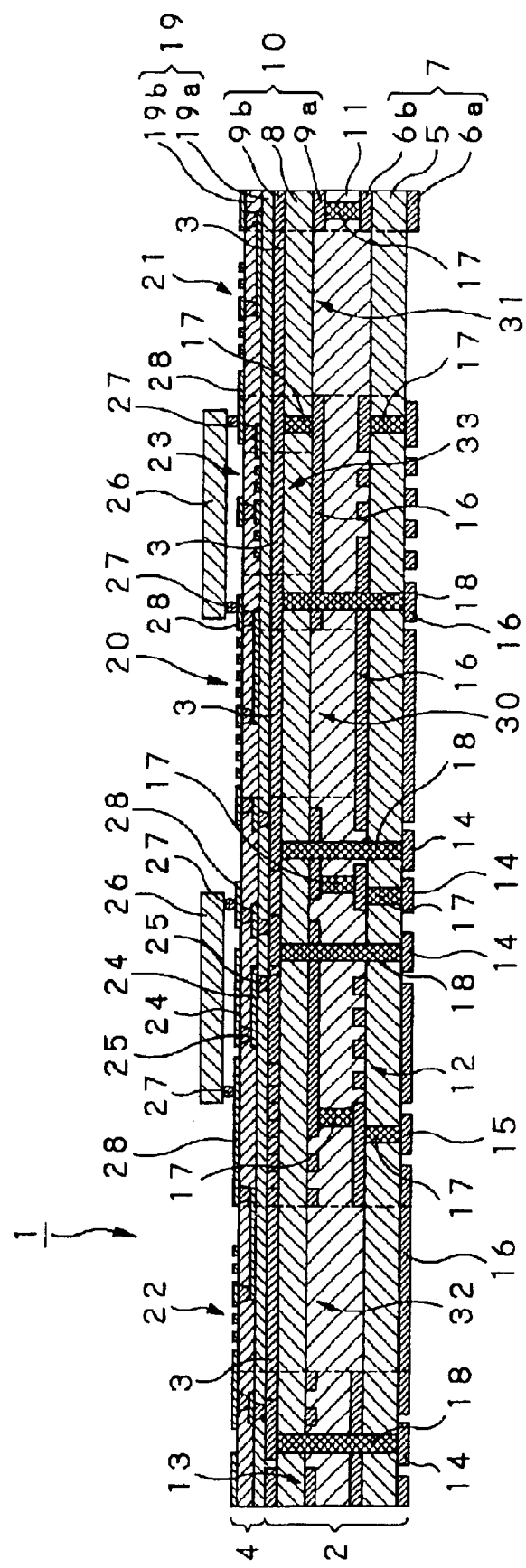
FIG. 1 shows a cross-sectional view of one example of a high-frequency module according to the present invention.

FIG. 1 shows a cross-sectional view of one example of a high-frequency module 1 according to the present invention.

The high-frequency module 1 according to the present invention is configured in the form of a package (BGA etc.) to realize high-density mounting or mounting parts or elements to a motherboard (base substrate) and to an interposer (intermediate substrate) with high density, and the high-frequency module 1 itself works as a functional element.

The high-frequency module 1 will be explained in detail. The high-frequency module 1 includes a base substrate 2, and the upper layer of the base substrate 2 is smoothed by a smoothed layer 3, as shown in FIG. 1. Also, the high-frequency module 1 includes a high-frequency element layer 4 formed on the smoothed layer 3.

The base substrate 2 may be a printed-circuit board, which includes a first wiring substrate 7 having a first wiring layer 6a and a second wiring layer 6b as pattern wiring layers formed on both sides of a first dielectric substrate 5 as a dielectric insulating layer, and a second wiring substrate 10 having a third wiring layer 9a and a fourth wiring layer 9b as pattern wiring layers formed on both sides of a second dielectric substrate 8 as a dielectric insulating layer, and the first wiring substrate 7 and the second wiring substrate 10 are put together via a preimpregnation substrate 11 as a dielectric insulating layer.

The first dielectric substrate 5 and the second dielectric substrate 8 are preferably made of material having low dielectric constant and low loss tangent (low tan δ), that is, material excellent in high-frequency characteristics. As such material, there are organic materials such as polyphenylethylene (PPE), bsmaleimidetriazine (BT-resin), polytetrafluoroethylene, polyimide, liquid polymer (LCP), polynorbornene (PNB), etc., or ceramic, or composite materials made from organic materials and ceramic. Also, other than above-described material, the first dielectric substrate 5 and the second dielectric substrate 8 are preferably made of material having refractoriness and chemical resistance. As a dielectric substrate made of such material, there is an epoxy resin substrate FR-5 available with comparably low cost.

The first and second wiring layers 6a, 6b and the third and fourth wiring layers 9a, 9b have functional elements such as a filter 12, a capacitor 13, and a signal wiring pattern 14, a power supply pattern 15, a ground pattern 16 for connecting these functional elements, which patterns are arranged in the form of a thin film using a copper foil. Also, passive elements such as inductors, resistors, and an antenna pattern can be arranged in the first and second wiring layers 6a, 6b and in the third and fourth wiring layers 9a, 9b.

Respective functional elements are electrically connected by the signal wiring pattern 14, the power supply pattern 15, and the ground pattern 16 by way of via holes 17 and through holes 18 which penetrate the first dielectric substrate 5 and the second dielectric substrate 8 with their inner surfaces copper-plated. Specifically, when providing the base substrate 2 with the via holes 17 and the through holes 18, holes are bored through the base substrate 2 using a drill or by irradiating a laser beam. And, the via holes 17 and the through holes 18 have their inner surfaces plated using metal material having conductivity such as copper. Thus, the signal wiring pattern 14, the power supply pattern 15, and the ground pattern 16 are electrically connected.

The base substrate 2, which are formed by putting the substrate 7 and the second wiring substrate 10 both made of comparatively inexpensive organic material together, can be formed with a lower cost as compared with the conventional case using a comparatively expensive Si substrate or glass substrate.

The base substrate 2 is not restricted to above-described configuration, and the number of layers or substrates can be arbitrarily determined. Also, the manner of forming the base substrate 2 is not restricted to above-described case of putting the first wiring substrate 7 and the second wiring substrate 10 together via the preimpregnation substrate 11, and copper foils with resin may be layered on both main surfaces of the first wiring substrate 7 and the second wiring substrate 10.

The smoothed layer 3 is a buildup surface which smooths the upper layer of the base substrate 2, that is the fourth wiring layer 9b formed on the second dielectric substrate 8, with high accuracy. Specifically, in forming the buildup surface, an insulating film made of organic material excellent in high-frequency characteristics is formed on the whole upper layer of the base substrate 2 in the first place, and then thus formed insulating film is polished until the fourth wiring layer 9b is exposed to outside. In result, the insulating film is formed on concave portions on the second dielectric substrate 8 on which the fourth wiring layer 9b is not formed such that concave portions are removed, that is, the upper layer of the base substrate 2 is smoothed. Thus, the upper layer of the base substrate 2 is smoothed by the smoothed layer 3 with high accuracy.

Next, in forming the high-frequency element layer 4, an insulating layer 19 is formed on the buildup surface in the first place, and then passive elements such as inductors 20, 21, 22, 23, capacitors, and resistors are arranged in the inner layer or in the outer layer of the insulating layer 19 by the thin-film forming technique and the thick-film forming technique. In the high-frequency element layer 4, these passive elements such as inductors 20, 21, 22, 23, etc. are electrically connected to the pattern wiring layers via wiring patterns 24, embedded conductors 25. The insulating layer 19 of the high-frequency element layer 4 is preferably made of organic material having low dielectric constant and low loss tangent (low tan δ), that is, organic material excellent in high-frequency characteristics. Also, such organic material preferably has refractoriness and chemical resistance. As such organic material, there are benzocyclobutene (BCB), polyimide, polynorbornene (PNB), liquid polymer (LCP), epoxy resin, and acrylic resin. The insulating layer 19 is formed by coating the buildup surface with such organic material by using coating methods excellent in coating uniformity and film thickness control with high accuracy such as the spin coating, curtain coating, roll coating, dip coating, etc.

Also, on the upper layer of the high-frequency element layer 4, there are arranged semiconductor chips 26 by the flip chip bonding. Under the processing of the flip chip bonding, bumps 27 are formed on electrodes of the semiconductor chips 26, and then the semiconductor chips 26 are connected to the high-frequency element layer 4 by the face down bonding. That is, the bumps 27 and electrodes 28 of the wiring patterns 24 of the high-frequency element layer 4 are put together to be heated and melted after upsetting and positioning the semiconductor chips 26. By employing the flip chip bonding, space for wiring becomes unnecessary as compared with the wire bonding, and the dimension along especially the height direction can be significantly reduced.

The passive elements and the semiconductor chips 26 formed in and on the high-frequency element layer 4 are electrically connected to the fourth wiring layer 9b of the base substrate 2 via the wiring patterns 24 and the embedded conductors 25.

According to the high-frequency module 1 employing the present invention, since the base substrate 2 is composed of multiple layers, the number of layers of the high-frequency element layer 4 can be reduced. That is, according to the high-frequency module 1 employing the present invention, the passive elements and the pattern wiring layers such as the wiring patterns 24, the embedded conductors 25 are arranged in the inner layer or in the outer layer of the high-frequency element layer 4, while the functional elements and the pattern wiring layer such as the signal wiring pattern 14 are arranged in the inner layer or in the outer layer of the base substrate 2. Thus, burden on the high-frequency element layer 4 can be significantly reduced as compared with the conventional case in which the whole passive and functional elements as well as pattern wiring layers are arranged on a Si substrate or on a glass substrate. So, the number of layers of the high-frequency element layer 4 can be reduced, and the high-frequency module 1 can be reduced in size further and the manufacturing cost can also be lowered.

According to the high-frequency module 1 employing the present invention, since the pattern wiring layers of the base substrate 2 and those of the high-frequency element layer 4 are separated, electrical interference raised between those pattern wiring layers can be suppressed, which improves the characteristics of the pattern wiring layers.

Furthermore, according to the high-frequency module 1 employing the present invention, since the upper layer of the base substrate 2 is smoothed by the smoothed layer 3 being a buildup surface, the high-frequency element layer 4 can be formed on the buildup surface with high accuracy.

In the high-frequency module 1 employing the present invention, the base substrate 2 is provided with wiring inhibition regions 30, 31, 32, 33 where the first and second wiring layers 6a, 6b and the third and fourth wiring layers 9a, 9b are not formed from the upper layer to the bottom or to the mid portion thereof along the thickness direction. And, the inductors 20, 21, 22, 23 of the high-frequency element layer 4 are formed directly above the wiring inhibition regions 30, 31, 32, 33.

Figure 2:
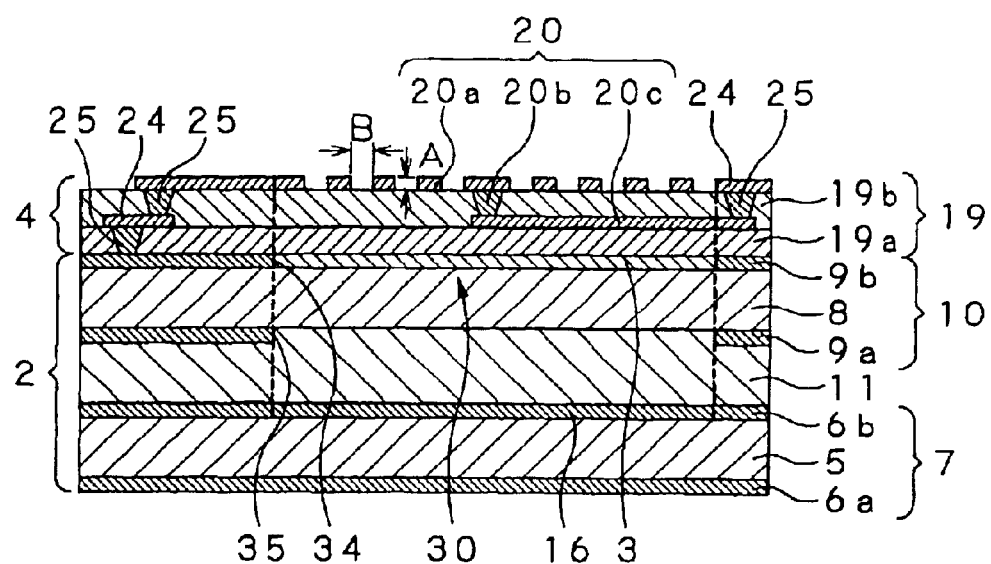
FIG. 2 shows an enlarged detailed view of a wiring inhibition region and an inductor of the high-frequency module according to the present invention.

Specifically, the wiring inhibition region 30 is a region corresponding to part of the high-frequency element layer 4 where the inductor 20 is arranged and part of the base substrate 2 beginning from the upper layer to the second wiring layer 6b thereof, as shown in FIG. 2.

Figures 3A, 3B, 3C:
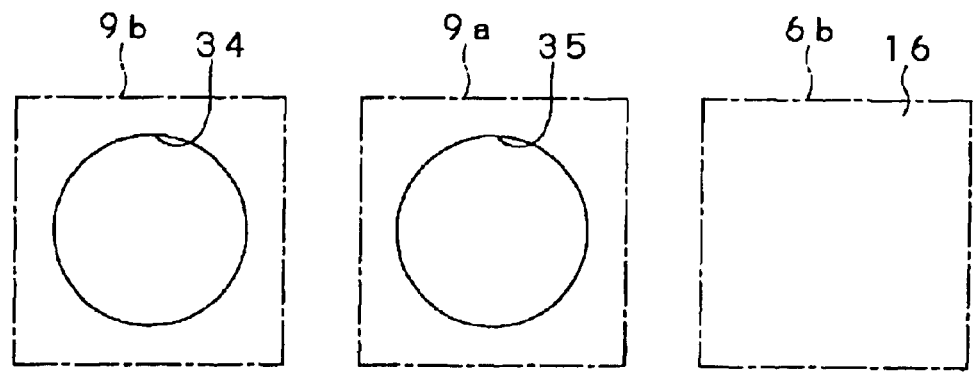

That is, the fourth wiring layer 9b is provided with a first wiring inhibition hole 34 directly under the inductor 20, as shown in FIG. 2 and FIG. 3A, while the third wiring layer 9a is provided with a second wiring inhibition hole 35 also directly under the inductor 20, as shown in FIG. 2 and FIG. 3B. And, the ground pattern 16 formed on the second wiring layer 6b and the inductor 20 are so located as to face each other through the first wiring inhibition hole 34 and the second wiring inhibition hole 35 with a predetermined distance maintained therebetween, as shown in FIG. 2 and FIG. 3C.

Figure 4:
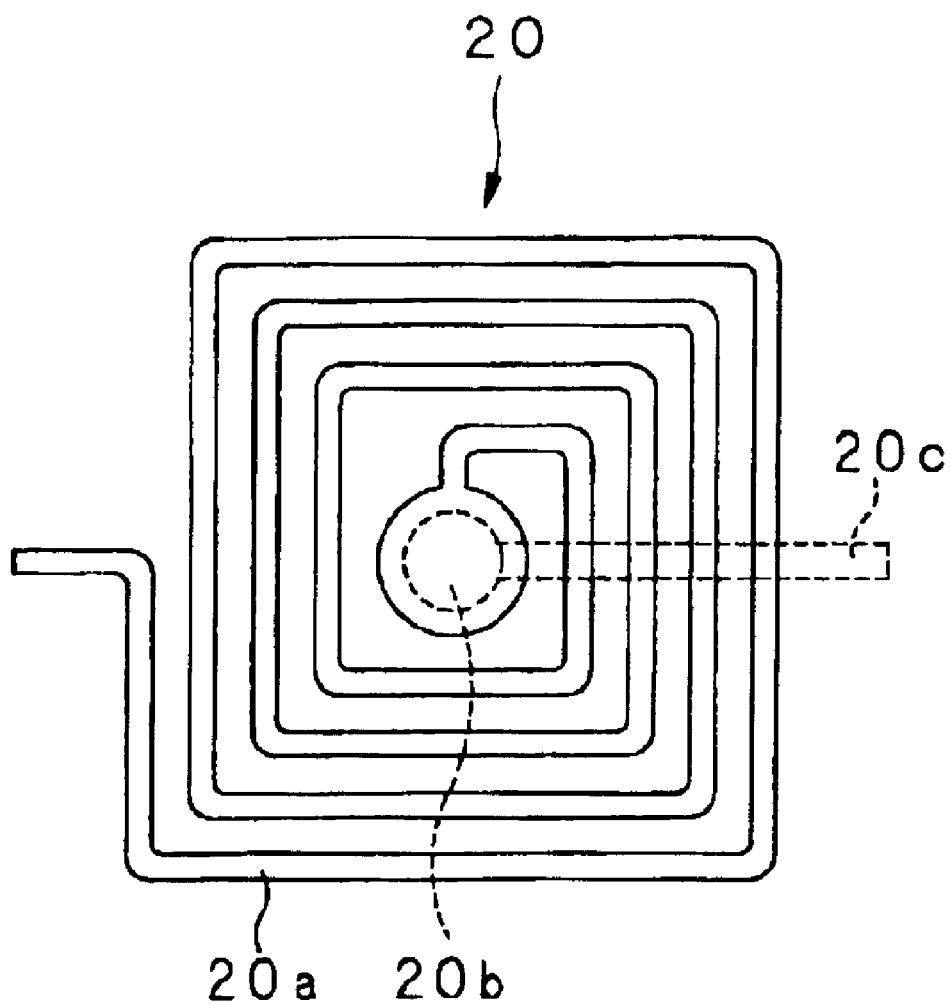
FIG. 4 shows a plan view showing the configuration of one example of the inductor.

On the other hand, the inductor 20 is located in the inner layer or in the outer layer of the insulating layer 19, and has a thin film coil pattern 20a in the form of a square-shaped spiral, an embedded conductor pattern 20b electrically connected to the inner end of the thin film coil pattern 20a, and a pullout conductor pattern 20c electrically connected to the embedded conductor pattern 20b, as shown in FIG. 2 and FIG. 4. The pullout conductor pattern 20c is pull out from the embedded conductor pattern 20b to the outside of the thin film coil pattern 20a, and the outer end of the thin film coil pattern 20a as well as the outer end of the pullout conductor pattern 20c are electrically connected to the wiring patterns 24 via the embedded conductors 25.

In forming the inductor 20, specifically, a first insulating layer 19a made of above-described organic material is formed on the smoothed base substrate 2 in the first place, as shown in FIG. 2.

Figure 5A:
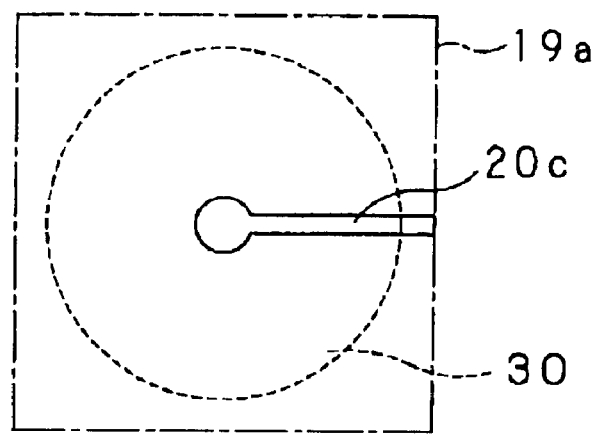

Next, a conductive film made of conductive metal material such as nickel (Ni) or copper (Cu) is formed on the whole first insulating layer 19a, and then the base of the pullout conductor pattern 20c is formed by etching the conductive film using a photoresist as a mask which is patterned to be of a predetermined shape under the photolithography technique. Then, the pullout conductor pattern 20c is completed by performing electrolytic plating using cupric sulfate solution to form a conductive film of several μm in thickness made of Cu, as shown in FIG. 2 and FIG. 5A.

Figure 5B:
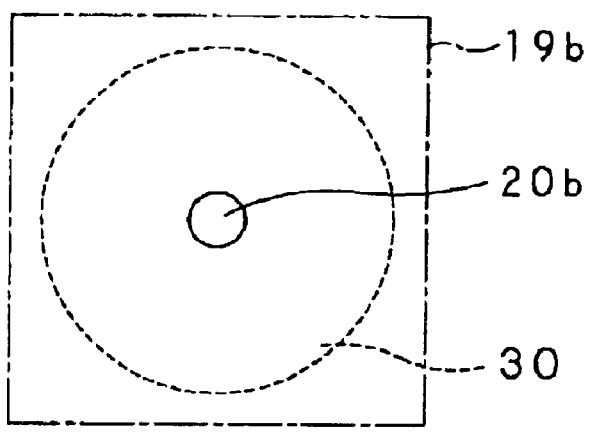

Next, a second insulating layer 19b made of above-described organic material is formed on the first insulating layer 19a having the pullout conductor pattern 20c formed thereon. Then, a via (hole) is formed such that the inner end of the pullout conductor pattern 20c is exposed to outside by etching the second insulating layer 19b using a photoresist as a mask which is patterned to be of a predetermined shape under the photolithography technique, as shown in FIG. 2 and FIG. 5B. Then, a conductive film made of Cu is formed by performing electrolytic plating using cupric sulfate solution with the photoresist left on the second insulating layer 19b. Then, the photoresist together with the conductive film formed thereon are removed. In result, the embedded conductor pattern 20b embedded into the second insulating layer 19b and the pullout conductor pattern 20c are electrically connected.

Figure 5C:
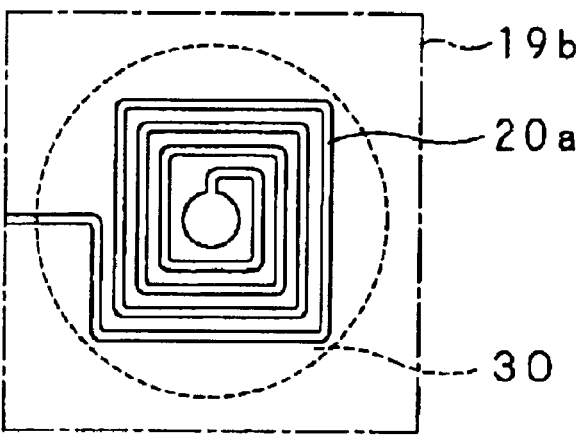

Next, a conductive film made of conductive metal material such as nickel (Ni) or copper (Cu) is formed on the whole second insulating layer 19b, and then the base of the thin film coil pattern 20a is formed by etching the conductive film using a photoresist as a mask which is patterned to be of a predetermined shape under the photolithography technique. Then, the thin film coil pattern 20a which is electrically connected to the embedded conductor pattern 20b is completed by performing electrolytic plating using cupric sulfate solution to form a conductive film of several μm in thickness made of Cu, as shown in FIG. 2 and FIG. 5C.

As shown in FIG. 2, the thickness A of the inductor 20 is preferably 10 μm or more as well as one and half time of the winding space B or less.

By employing above-described plating method, the thickness A of the inductor 20 can be increased as compared with the case employing the conventional sputtering method in which the film thickness is approximately only from 0.5 to 2 μm. Since the thickness A of the inductor 20 becomes more than 10 μm, the series resistance value of the inductor 20 can be reduced, and high Q value of the inductor 20 can be obtained. On the other hand, when the thickness A of the inductor 20 is one and half time of the winding space B, that is space between adjacent windings of the thin film coil pattern 20a or less, the inductor 20 can be formed with high accuracy.

Also, the inductor 20 may be formed to be of the predetermined thickness A by other thick-film forming techniques different from above-described plating method.

Figure 6:
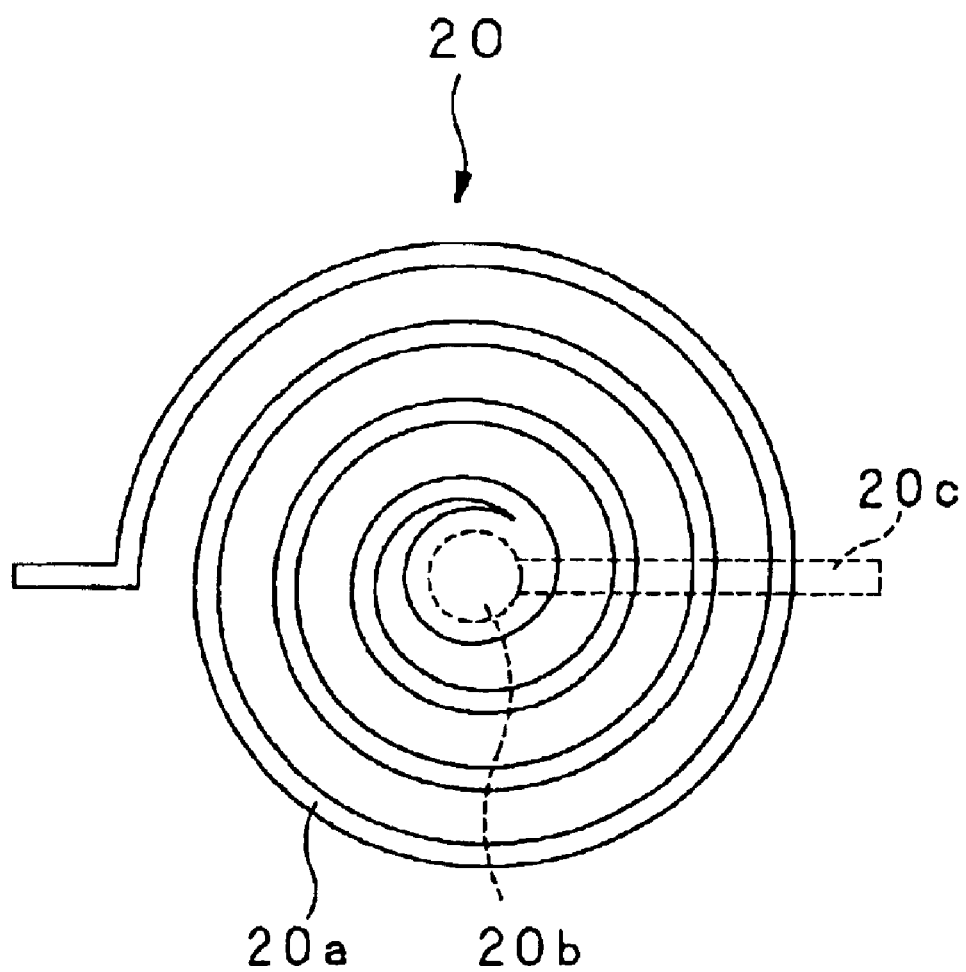
FIG. 6 shows a plan view showing the configuration of another example of the inductor.

Furthermore, the inductor 20 is not restricted to the square-shaped spiral in shape shown in FIG. 4, and may be in the form of a circular-shaped spiral, as shown in FIG. 6.

Other inductors 21, 22, 23 are of the same shape as that of the inductor 20, and are also formed similarly. So, detailed description will be omitted.

As in the above, in the high-frequency module 1 employing the present invention, the base substrate 2 is provided with wiring inhibition regions 30, 31, 32, 33 where the first and second wiring layers 6a, 6b and the third and fourth wiring layers 9a, 9b are not formed from the upper layer to the bottom or to the mid portion thereof along the thickness direction. And, the inductors 20, 21, 22, 23 of the high-frequency element layer 4 are formed directly above the wiring inhibition regions 30, 31, 32, 33. Thus, it becomes possible for the high-frequency module 1 to have a space between the inductors 20, 22, 23 and the ground patterns 16, which can significantly reduce the coupling capacitance between the inductors 20, 22, 23 and the ground patterns 16. Furthermore, since the inductor 21 of the high-frequency element layer 4 is formed directly above the wiring inhibition region 31 where the first and second wiring layers 6a, 6b and the third and fourth wiring layers 9a, 9b are not formed from the upper layer to the bottom of the base substrate 2, the characteristics of the inductor 21 can further be improved.

Thus, high Q value of the inductors 20, 21, 22, 23 can be obtained, and improved characteristics of the inductors 20, 21, 22, 23 can be obtained in a simplified configuration as compared with the case employing an Si substrate in which, inductors are arranged on the Si substrate, and the Si substrate is provided with holes directly under the inductors, or space is prepared between the inductors and the Si substrate. In result, by employing the high-frequency module 1, the characteristics of the inductors 20, 21, 22, 23 can further be improved, and miniaturization and decreasing in weight of a communication terminal equipment becomes possible.

INDUSTRIAL APPLICABILITY

As in the above, according to the high-frequency module employing the present invention, since the inductors are formed directly above the regions where the pattern wiring layers of the base substrate are not formed, the coupling capacitance between the inductors and the pattern wiring layers can be reduced, and high Q value of the inductors can be obtained. In result, by employing the high-frequency module, the characteristics of the inductors can further be improved, and miniaturization and decreasing in weight of a communication terminal equipment becomes possible.

What is claimed is:

1. A high-frequency module, comprising:
 a substrate made with organic material and having multiple alternating pattern wiring layers and dielectric insulating layers made with organic material,
 a buildup surface layer on an upper surface of the substrate,
 an insulating layer on the buildup surface; and a high frequency element layer formed over the buildup surface, the high frequency element layer including an insulating layer on the buildup surface, and an inductor insulated from the buildup surface by the insulating layer, wherein, the substrate has a wiring pattern-free region void of any wiring pattern, the wiring pattern-free region extending from the upper surface to at least a mid section of the substrate along the thickness direction of the substrate, and the inductor of the high-frequency element layer is located directly above the wiring pattern-free region along the thickness direction of the substrate.

2. The high-frequency module of claim 1, wherein the wiring pattern-free region extends to a bottom surface of the substrate such that the wiring pattern-free region is void of any wiring pattern within the substrate.

3. The high-frequency module of claim 1, wherein the inductor is a thick-film inductor.

4. The high-frequency module of claim 1, comprising a plurality of inductors in the high frequency element layer, and a like plurality of corresponding wiring pattern-free regions in the substrate.

5. The high-frequency module of claim 4, wherein all inductors in the high frequency element layer have a corresponding wiring pattern-free region in the substrate.

* * * * *